(12) United States Patent
Anderson et al.

(10) Patent No.: US 8,236,611 B1
(45) Date of Patent: Aug. 7, 2012

(54) DIE SINGULATION METHOD AND PACKAGE FORMED THEREBY

(75) Inventors: Robert C. Anderson, Tucson, AZ (US); Randy J. Shul, Albuquerque, NM (US); Peggy J. Clews, Tijeras, NM (US); Michael S. Baker, Albuquerque, NM (US); Maarten P. De Boer, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 188 days.

(21) Appl. No.: 12/758,833

(22) Filed: Apr. 13, 2010

(51) Int. Cl.
*H01L 21/00* (2006.01)

(52) U.S. Cl. .............. 438/113; 438/460; 257/E21.483

(58) Field of Classification Search .................. 438/113, 438/460
See application file for complete search history.

(56) References Cited

U.S. PATENT DOCUMENTS

| | | | |
|---|---|---|---|
| 5,501,893 A | 3/1996 | Laermer et al. | |
| 5,597,766 A | 1/1997 | Neppl | |
| 6,573,156 B1 | 6/2003 | Wang et al. | |
| 6,777,267 B2 | 8/2004 | Ruby et al. | |
| 7,335,576 B2 | 2/2008 | David et al. | |
| 7,507,638 B2 | 3/2009 | Mancini et al. | |
| 7,566,634 B2 | 7/2009 | Beyne et al. | |

OTHER PUBLICATIONS

Masayoshi Kumagai, et al, Advanced Dicing Technology for Semiconductor Wafer—Stealth Dicing, EIII Transactions on Semiconductor Manufacturing, vol. 20, No. 3, Aug. 2007.

*Primary Examiner* — William D Coleman
(74) *Attorney, Agent, or Firm* — Lowell Carson (57) ABSTRACT

A method is disclosed for singulating die from a substrate having a sacrificial layer and one or more device layers, with a retainer being formed in the device layer(s) and anchored to the substrate. Deep Reactive Ion Etching (DRIE) etching of a trench through the substrate from the bottom side defines a shape for each die. A handle wafer is then attached to the bottom side of the substrate, and the sacrificial layer is etched to singulate the die and to form a frame from the retainer and the substrate. The frame and handle wafer, which retain the singulated die in place, can be attached together with a clamp or a clip and to form a package for the singulated die. One or more stops can be formed from the device layer(s) to limit a sliding motion of the singulated die.

25 Claims, 9 Drawing Sheets

DIE SINGULATION METHOD AND PACKAGE FORMED THEREBY

GOVERNMENT RIGHTS

This invention was made with Government support under Contract No. DE-AC 04-94AL85000 awarded by the U.S. Department of Energy. The Government has certain rights in the invention.

CROSS REFERENCE TO RELATED APPLICATIONS

The present application is related to U.S. patent application Ser. No. 12/758,838, entitled "Die Singulation Method" of common assignee which is being filed on the same date as this application, the contents of which are incorporated herein by reference in their entirety.

FIELD OF THE INVENTION

The present invention relates in general to semiconductor processing, and in particular to a method for singulating one or more die from a substrate by etching and to a package for the singulated die which is formed upon singulation of the die using the method of the present invention.

BACKGROUND OF THE INVENTION

A large number of semiconductor devices are typically fabricated on a common semiconductor wafer having a diameter up to 12 inches or more and then are separated (i.e. singulated) for packaging as individual devices. These semiconductor devices, which can be integrated circuits (ICs), microprocessors, microelectromechanical systems (MEMS), microfluidic devices, sensors, etc., are conventionally singulated by saw cutting. The use of saw cutting requires a spacing (i.e. a street) between adjacent devices which are being singulated with this spacing being up to 100 microns or more wide; and this spacing limits the number of devices which can be fabricated from the semiconductor wafer. Additionally, saw cutting generates debris which can contaminate the devices or become lodged in moveable members of MEMS devices or in fluid channels of microfluidic devices. Furthermore, saw cutting must be performed along straight lines in a serial fashion one cut at a time; and this limits the shape of the devices to being square or rectangular and generally all of the same size. Saw cutting is also time consuming since each saw cut must be carefully aligned with each street separating adjacent rows of devices to prevent damage to the devices. For all of the above reasons, conventional saw cutting is disadvantageous so that an advance in the art is needed to improve the singulation of devices from semiconductor wafers.

The present invention provides such an improvement in the art by providing a method for singulating one or more die from a semiconductor wafer (i.e. a substrate) which relies on etching one or more trenches into the wafer from a backside thereof opposite a device side of the wafer. A handle wafer is then attached to the backside of the semiconductor wafer according to the present invention; and then a sacrificial layer (e.g. comprising silicon dioxide or a silicate glass) on the device side of the wafer is partially or completely etched away to finish the singulation process and to release any microelectromechanical systems (MEMS) devices which may be present on the die. A retainer, which is generally formed from a device layer (e.g. comprising monocrystalline silicon or polycrystalline silicon) on the device side of the substrate, is anchored to a portion of the semiconductor wafer outside of the die being singulated to form a frame about the die after singulation thereof, thereby retaining the die in place for further processing, movement, storage, transporting, etc., of the die.

The present invention is compatible with standard semiconductor processes and allows all of the die on the wafer to be singulated simultaneously in a parallel process. This saves time and cost and also increases yield and performance by minimizing die handling and particulates which would otherwise occur if conventional sawing were used to singulate the die. Additionally, by retaining the die in place after singulation between the frame and the handle wafer, post-processing of the die can be performed, for example, to deposit a metal onto the die, or to add a wear-resistant material, an adhesion-reducing material, a stiction-reducing material, or a passivation material onto the die. Once the frame is lifted off of the handle wafer, all of the die can remain in place in a spaced-apart arrangement on the handle wafer so that they can be individually picked up and permanently packaged (e.g. in a dual in-line package or in a pin grid array package). A package can also be formed for the singulated die according to the present invention by leaving the frame temporarily fastened to the handle wafer using a clamp or a clip.

These and other advantages of the present invention will become evident to those skilled in the art.

SUMMARY OF THE INVENTION

The present invention relates to a method for singulating a die from a substrate which comprises the step of providing the substrate having a top side and a bottom side, with a plurality of layers being disposed on the top side of the substrate including a sacrificial layer (e.g. comprising silicon dioxide or a silicate glass) and a device layer (e.g. comprising monocrystalline silicon or polycrystalline silicon) located above the sacrificial layer, with the device layer being patterned to form a retainer which is anchored to a first portion of the substrate which in combination with the device layer will form a frame about the die after singulation of the die, and with the retainer extending over a second portion of the substrate which will be singulated to form the die. The method also includes the steps of etching at least one trench into the substrate from the bottom side thereof to define a shape for the die being singulated, with the etching being terminated proximate to the sacrificial layer; attaching a handle wafer to the bottom side of the substrate; and etching away at least a part of the sacrificial layer to singulate the die, with the singulated die being retained inside of the frame which is attached to the handle wafer.

The method can further comprise the steps of detaching (i.e. separating) the frame from the handle wafer, with the die remaining on the handle wafer (e.g. free-standing on the handle wafer or attached thereto with an adhesive). The method can also optionally include the step of depositing a layer of a material (e.g. a metal, a wear-resistant material, an adhesion-reducing material, a stiction-reducing material, a passivation material, or combinations thereof) onto a surface of the die prior to the step of detaching the frame from the handle wafer.

The handle wafer can comprise, for example, a semiconductor substrate. In some cases, both the substrate and the handle wafer can comprise silicon (e.g. a bulk silicon substrate or a semiconductor-on-insulator substrate). The at least one device layer can comprise silicon (e.g. a monocrystalline or polycrystalline silicon layer).

The step of etching the at least one trench into the substrate can comprise anisotropically etching the at least one trench using a deep reactive ion etching (DRIE) process. The step of etching away at least a part of the sacrificial layer to singulate the die and to complete the frame can comprise isotropically etching the sacrificial layer (e.g. using an etchant comprising hydrofluoric acid).

The step of attaching the handle wafer to the substrate can be performed in several different ways according to the present invention. For example, the handle wafer can be attached to the substrate by inserting the handle wafer and the substrate into a wafer carrier having a plurality of slots for holding wafers, with the handle wafer and the substrate being located in the same slot of the wafer carrier. As another example, the handle wafer can be attached to the substrate by clamping the handle wafer to the substrate using one or more clamps (e.g. spring clamps or a clamp ring) or one or more clips (e.g. sliding clips). As yet another example, the handle wafer can be attached to the substrate using an adhesive. The handle wafer attached to the backside of the substrate can form a package for the singulated die.

The present invention further relates to a method for singulating a die formed from a semiconductor substrate having a sacrificial material disposed thereon. The method comprises the step of forming a retainer on a first portion of the semiconductor substrate which will form a frame about the die after singulation of the die, with the retainer extending over a second portion of the semiconductor substrate which will be singulated to form the die. The method also includes the steps of anisotropically etching a trench about the die by anisotropically etching through the semiconductor substrate from a bottom side thereof opposite the retainer; attaching a handle wafer to the bottom side of the semiconductor substrate; and at least partially removing the sacrificial material from the semiconductor substrate by isotropically etching the sacrificial material, thereby separating the first portion of the semiconductor substrate which forms the frame from the second portion of the semiconductor substrate which forms the singulated die.

The method can further comprise the step of detaching the frame from the handle wafer, with the die remaining on the handle wafer. The method can also comprise the step of depositing a layer of a material onto a surface of the die prior to the step of detaching the frame from the handle wafer. The material deposited onto the surface of the die can be, for example, a layer of metal.

The step of forming the retainer on the first portion of the semiconductor substrate can comprise depositing and patterning one or more layers of polycrystalline silicon on the semiconductor substrate.

The semiconductor substrate can comprise silicon; and the sacrificial material can comprise silicon dioxide or a silicate glass. The handle wafer can also comprise silicon.

The step of anisotropically etching the trench about the die can comprise anisotropically etching the trench using a deep reactive ion etching (DRIE) process.

The step of attaching the handle wafer to the semiconductor substrate can comprise inserting the handle wafer and the semiconductor substrate into a slot of a wafer carrier with both the handle wafer and the semiconductor substrate being located in the same slot, and with the handle wafer being in contact with the bottom side of the semiconductor substrate. The step of attaching the handle wafer to the semiconductor substrate can also comprise clamping the handle wafer to the semiconductor substrate using at least one clamp or at least one clip.

The present invention also relates to a package for a singulated die formed from a substrate. The package comprises a frame formed at least in part from the substrate upon singulation of the die, with the frame including a retainer which extends over the singulated die; and a handle wafer attached to the frame, with the handle wafer extending beneath the singulated die. Both the frame and the singulated die are formed from the substrate by an trench which is etched around the die during singulation of the die.

The handle wafer can be attached to the frame by one or more temporary fasteners which can be selected from the group consisting of a clamp, a clip, or a slot of a wafer carrier wherein both the substrate and handle wafer are located. Alternately, the handle wafer can be attached to the frame with a temporary fastener which comprises an adhesive.

The substrate can comprise silicon. The handle wafer, in some cases, can also comprise silicon.

In some embodiments of the present invention, the die can include one or more stops thereon, with each stop being located proximate to the retainer to limit a sliding movement of the die within the package after singulation thereof.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
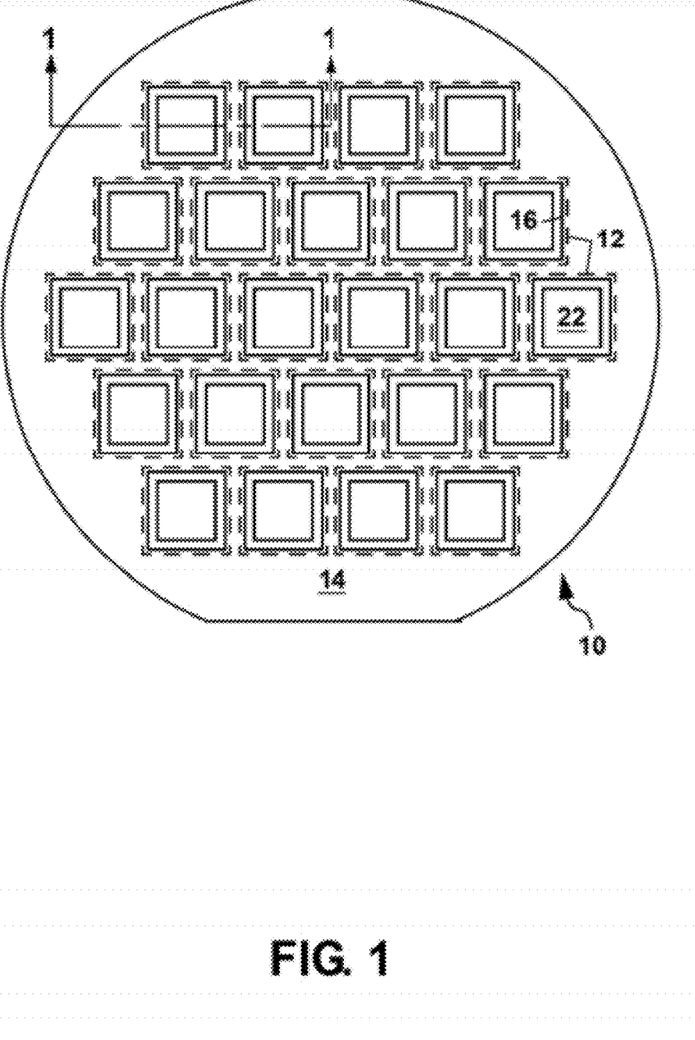
FIG. 1 shows a schematic plan view of a substrate having a plurality of devices formed thereon prior to singulating a plurality of die from the substrate according to the method of the present invention.
Figure 2:
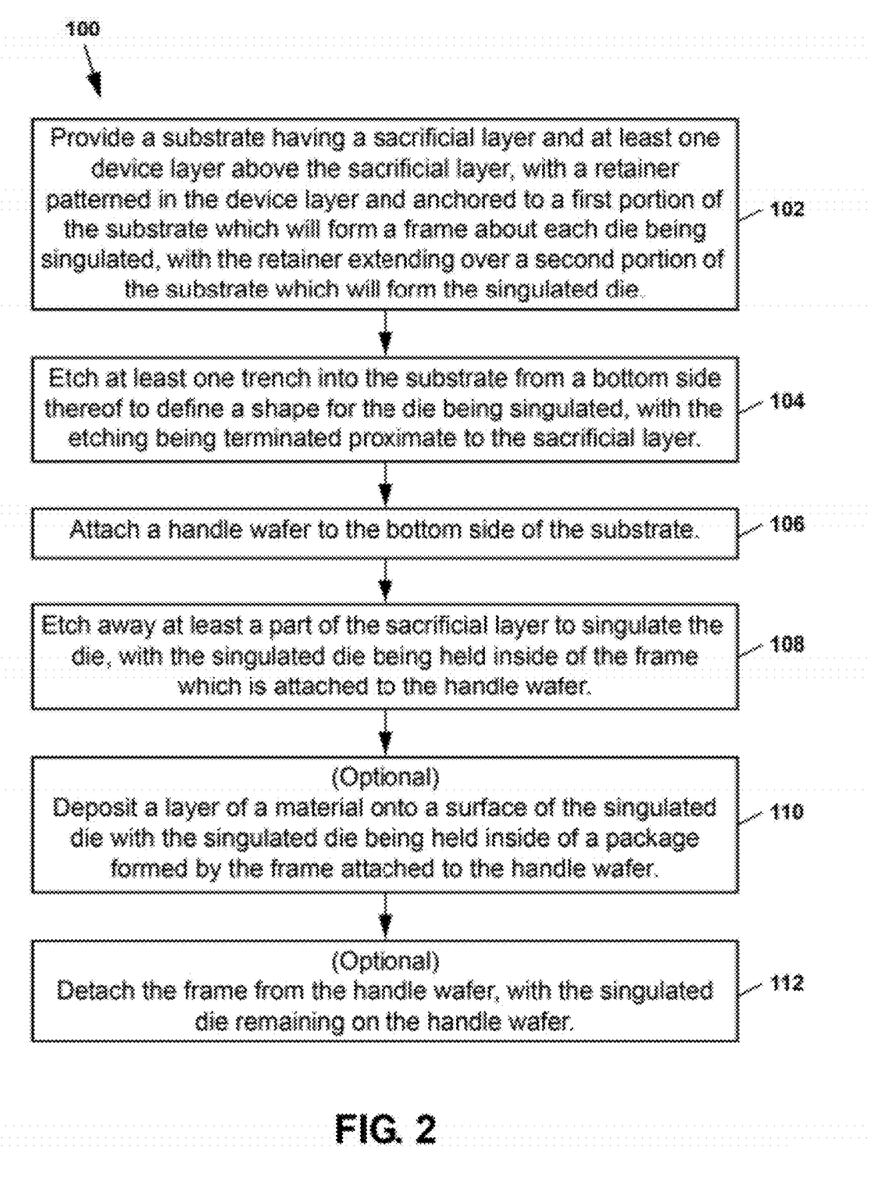
FIG. 2 illustrates a method for singulating one or more die from a substrate according to the present invention.

FIG. 1 shows a schematic plan view of a substrate 10 which can be processed according to the method 100 of the present invention illustrated in FIG. 2 to form one or more singulated die 12. The substrate 10 can comprise a semiconductor substrate although those skilled in the art will understand that the method of the present invention can also be applied to other types of substrates including metal substrates, polymer substrates, and substrates formed of insulating dielectric materials (e.g. alumina, fused silica, crystalline quartz, etc.). In FIG. 1, each singulated die 12 is indicated by a dashed box. The method 100 also forms a frame 14 about the singulated die 12 from a portion of the substrate 10 which is not used for the die 12, with the frame having a retainer 16 which extends over the singulated die 12 to hold the die 12 in place after singulation. The frame 14 together with a handle wafer 18 located beneath the frame 14 can also form a package 20 for holding, transporting, or storing the singulated die 12, or for further processing of the singulated die 12 as will be discussed hereinafter.

The method 100 for singulating the die 12 from the substrate 10 is summarized in FIG. 2 and will be described hereinafter with reference to FIGS. 3A-3I which show a series of schematic partial cross-section views along the section line 1-1 in FIG. 1.

The method 100 will be described hereinafter for a semiconductor substrate 10 although those skilled in the art will understand that the method 100 of the present invention can also be adapted for use with non-semiconductor substrates. In a first step 102, a substrate 10 is provided which can comprise, for example, a semiconductor material with one or more devices 22 (see FIG. 3A) being formed thereon by a series of well-known semiconductor processing steps. The devices 22 can be, for example, microelectromechanical systems (MEMS), microfluidic devices, sensors, or integrated circuits (ICs).

The semiconductor substrate 10 can include a plurality of layers thereon including one or more sacrificial layers 24 and one or more device layers 28 (e.g. comprising monocrystalline silicon or polycrystalline silicon). As an example, the semiconductor substrate 10 can be a silicon-on-insulator (SOI) substrate having a monocrystalline silicon base (also referred to herein as a substrate 10), with a sacrificial layer 24 which comprises silicon dioxide disposed on a top side 26 of the monocrystalline silicon base, and with a device layer 28 comprising monocrystalline silicon disposed on the sacrificial layer 24. As another example, the semiconductor substrate 10 can be a bulk silicon substrate comprising monocrystalline silicon with an sacrificial layer 24 formed on the top side 26 of the bulk silicon substrate 10 (e.g. as silicon dioxide, or as a silicate glass such as phosphosilicate glass, borophosphosilicate glass, or TEOS which can be deposited from the thermal decomposition of tetraethylorthosilicate), and with one or more device layers 28 comprising polycrystalline silicon (also termed polysilicon) being located above the sacrificial layer 24. Additional sacrificial layers 24 can be provided between or above the device layers 28 as needed to build up the structure of each device 22 being formed on the substrate 10. In other embodiments of the present invention, other types of semiconductor substrates can be used including substrates 10 formed of germanium and silicon-germanium and III-V compound semiconductors (e.g. GaAs and InP).

Figure 3A:
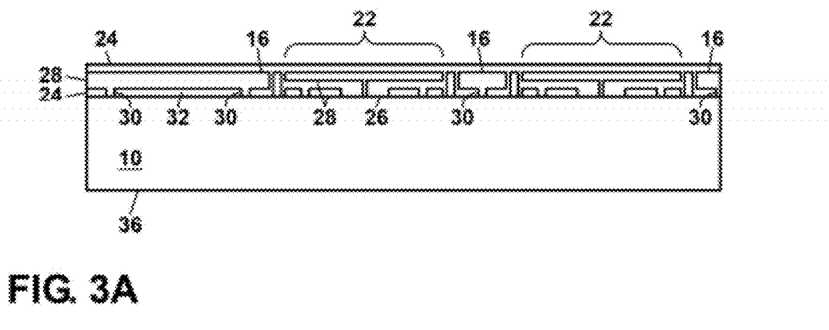
FIGS. 3A-3I show schematic partial cross-section views along the section line 1-1 in FIG. 1 to illustrate various process steps in the method of the present invention.

During fabrication of the devices 22 on the substrate 10, one or more of the device layers 28 can be patterned to form the retainer 16. This is shown in FIG. 3A which is a schematic partial cross-section view along the section line 1-1 in FIG. 1. The retainer 16 can be anchored to the substrate 10 in step 102 during the fabrication of the devices 22 on the substrate 10. Anchoring of the retainer 16 to the substrate 10 can be performed, for example, by etching one or more openings 30 through the a first-deposited sacrificial layer 24 to expose the substrate 10 in the openings 30, and then blanket depositing a device layer 28 over the substrate 10 and in the openings 30. The openings 30, can be annular to surround each die 12 being singulated. One or more additional openings 30 can be used to encapsulate portions 32 of the sacrificial layer 24 outside of the die 12 being singulated so that the encapsulated portions 32 of the sacrificial layer 24 can form a part of the frame 14.

The term "die" as used herein can be either singular or plural. The term "singulation" as used herein refers to separating one or more die from a substrate, with each die comprising a portion of the substrate 10. The term "patterning" as used herein refers to a series of well-known semiconductor processing steps which can be repeated as needed to build up the structure of each device 22 being formed on the substrate 10. These steps include applying a photoresist to the substrate 10, prebaking the photoresist, aligning the substrate 10 with a photomask, exposing the photoresist through the photomask, developing the photoresist, baking the substrate 10, etching away portions of the substrate 10 or one or more of the layers 24, 28 thereon which are not protected by the photoresist, and stripping the photoresist off of protected areas of the substrate 10 or layers 24, 28 so that further processing can take place.

In step 104, one or more trenches 34 are etched through the substrate 10 from a bottom side 36 thereof. These trenches 34 can be annular about each die 12 being singulated to determine a shape for each die 12. Alternately, the trenches 34 can comprise a plurality of straight-line or zig-zag trenches which intersect as needed to determine the shape for each die 12. In preparation for this etching step 104 any layers deposited onto the bottom side 36 of the substrate 10 during fabrication of the devices 22 and retainers 16 can be removed to expose the bottom side 36 of the substrate 10. This can be done, for example, using a mechanical polishing step.

The trenches 34 can be etched through the substrate 10 in step 104 by an anisotropic etching process which produces substantially straight sidewalls for the trenches 34 which can have a width of 50-100 µm, for example. The anisotropic etching process can comprise a so-called "Bosch process" which is also referred to herein as Deep Reactive Ion Etching (DRIE) and which is disclosed in U.S. Pat. No. 5,501,893 to Laermer et al., which is incorporated herein by reference.

Briefly, an etch mask (not shown) is provided over the bottom side 36 of the substrate 10 with openings photolithographically defined at the locations of each trench 34 to be etched through the substrate 10, with these openings being aligned to the retainers 16 on the top side 26 of the substrate 10. Additional openings can be photolithographically defined at locations within the die 12 being singulated, for example, when one or more microfluidic connections are to be provided through the substrate 10 to fluid channels formed on the top side 26 of the substrate 10 within each die 12. The DRIE etch process is then initiated to etch the trenches 34 through the substrate 10 from the bottom side 36 thereof. The DRIE etch process uses an iterative plasma deposition and etch cycle wherein a polymer etch inhibitor is conformally deposited as a film over the bottom side 36 of the substrate 10 and in the trenches 34 being etched through the substrate 10 during a deposition cycle, and then the film and a portion of the silicon substrate material in the trenches 34 is then preferentially removed during an etching cycle.

Figure 3B:
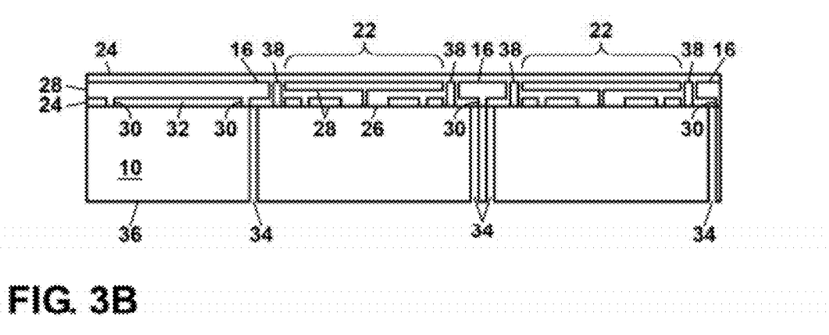

The polymer film, which can be formed using a plasma containing a fluorocarbon such as $C_4F_8$ and an inert carrier gas such as argon, deposits conformally over a bottom surface and sidewalls of the trenches 34 being etched from the bottom side 36 of the substrate 10. During a subsequent etch cycle using a plasma formed with a fluorine-containing gas such as $SF_6$ and the inert carrier gas (e.g. Ar), the polymer film is quickly etched away from the bottom surface of the trenches 34 so that etching of the underlying silicon substrate material can take place, while the polymer film is etched away more slowly from the sidewalls of the trenches 34. This exposes the silicon substrate material at the bottom surface of the trenches 34 to reactive fluorine atoms from the $SF_6$/Ar-based plasma, with the fluorine atoms then being responsible for etching the exposed bottom surface while the sidewalls are protected from being etched by the remaining polymer film. Before the polymer film on the sidewalls of the trenches 34 is completely removed by action of the $SF_6$/Ar-based plasma, the polymer deposition step using the $C_4F_8$/Ar-based plasma is repeated. This cycle is repeated many times, with each polymer deposition and etch cycle generally lasting about 10 seconds or less, until the etching is terminated proximate to the first-deposited sacrificial layer 24. The first-deposited sacrificial layer 24 can act as an etch stop for the DRIE process since the sacrificial layer 24 comprising silicon dioxide or a silicate glass is much more resistant to etching by the $C_4F_8$/Ar-based plasma than the silicon substrate material. At the end of this etching step 104, the die 12 being singulated are still attached to the substrate 10 by the sacrificial layer(s) 24 as shown in FIG. 3B. This maintains the structural integrity of the substrate 10 so that the substrate 10 can be handled and manipulated to attach a handle wafer 18 to the bottom side 36 of the substrate 10 in step 106 which will be discussed hereinafter.

In the example of FIGS. 3A-3I, a plurality of stops 38 can be formed on the substrate 10 from one or more of the device layers 28 at the same time the retainers 16 are formed. These stops 38, which are optional, are omitted from FIG. 1 for clarity, but are schematically illustrated in FIGS. 3A-3I. The stops 38 can be formed, for example, as a wall with a height of a few microns or more which extends around the periphery of each die 12 being singulated proximate to the retainers 16, or as a plurality of raised areas (e.g. posts or mesas) which are located about the periphery of each die 12 (e.g. at the corners and/or midpoints of square or rectangular die 12).

The stops 38 will come into contact with the retainers 16 to limit a sliding movement of the die 12 after singulation. By limiting the sliding movement of the singulated die 12, the retainers 16 can be made to extend over the die 12 by a smaller lateral extent than would otherwise be needed to retain the die 12 in place after singulation. This can be advantageous to reduce the amount of space on the substrate 10 which is required for the frame 14, thereby increasing a usable area $A_{usable}$ on the die 12 which can be used for the device(s) 22 therein.

Figure 4:
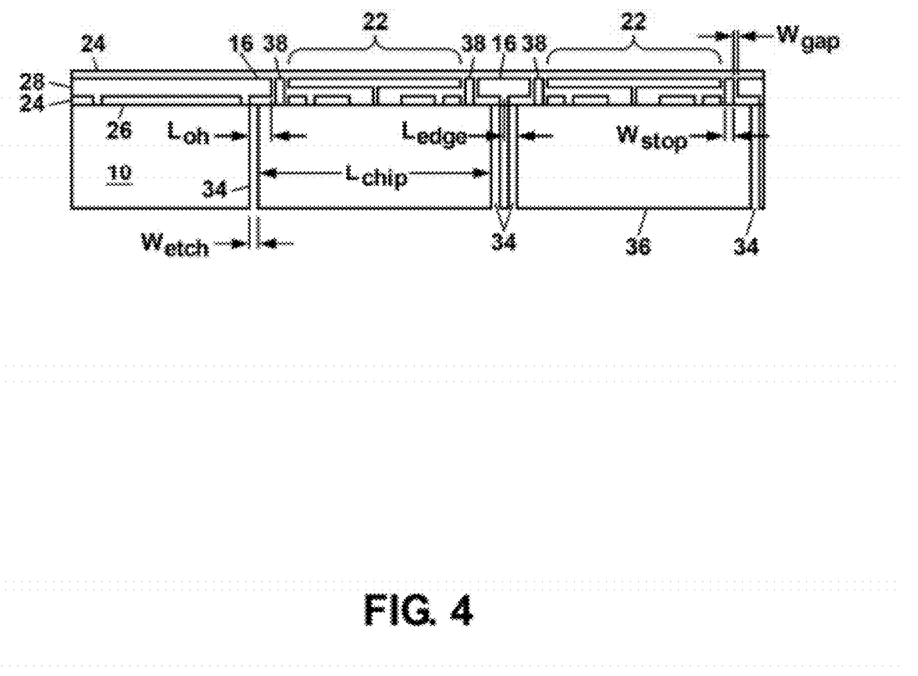
FIG. 4 shows a schematic partial cross-section view along the section line 1-1 in FIG. 1 to show various dimensions discussed with reference to the method of the present invention.

FIG. 4 shows a schematic partial cross-section view substantially identical to FIG. 3B but with labels to indicate the various dimensions which are used hereinafter in determining the usable area $A_{usable}$ on the die 12 when the stops 38 are omitted and when the stops 38 are used. In FIG. 4, the width of the etched trenches 34 is given by $W_{etch}$, an overhang distance of the retainers 16 is given by $L_{oh}$, the distance from an outside edge of the etched trenches 34 to a center of the frame 14 between each adjacent pair of die 12 is given by $L_{edge}$, and a length of the die 12 is given by $L_{chip}$. The area between the retainers 16 defines the usable area $A_{usable}$ where the devices 22 can be located on each die 12 when the stops 38 are not used; and the area between the stops 38 defines the usable area $A_{usable}$ where the devices 22 can be located on each die 12 when the stops 38 are used.

With the various dimensions defined as shown in FIG. 4 and in the absence of any stops 38, the die 12 will be retained between the frame 14 and the handle wafer 18 (see FIGS. 3C-3E) when the retainer 16 has an overhang distance $L_{oh}$ given by:

$$L_{oh} = 2f_r W_{etch}$$

where $f_r$ is a constant, which is somewhat greater than one, to account for process variations in the locations of the etched trenches 34 relative to the retainers 16 (e.g. due to mask alignment errors and any lateral etching of the trenches 34 during the DRIE process). As an example, $f_r$ can be equal to 1.25.

The devices 22 formed on each die 12 must also be located a distance $f_r W_{etch}$ away from the retainers 16 to prevent possible damage to the devices 22 due to a sliding movement of the die 12 in the frame 14. Thus, in a given lateral direction, the devices 22 can occupy the die 12 over a length $L_{occupied}$ given by:

$$L_{occupied} = L_{chip} - 2f_r W_{etch} - 2(L_{oh} - W_{etch}) = L_{chip} - W_{etch}(6f_r - 2)$$

If the die 12 are square, then the usable area $A_{usable}$ which can be used for the devices 22 in the die 12 expressed as a percentage of the total area of the die 12 will be given by:

$$A_{usable} = 100 \cdot \frac{L_{occupied}^2}{(L_{chip} + 2W_{etch} + 2L_{edge})^2}$$

When the die 12 are rectangular, the quantities in the numerator and denominator for the above equation for the usable area $A_{usable}$ can be calculated for each side of the rectangular die 12 and then multiplied to determine the usable area $A_{usable}$ for the devices on the rectangular die 12.

When stops 38 are provided on the substrate 10 to limit the sliding movement of the die 12 after removal of the sacrificial layer(s) 24, the overhang distance $L_{oh}$ can be made smaller by about a factor of two with $L_{oh}$ given by:

$$L_{oh} = f_s W_{etch}$$

where $f_s$ is a constant, which is somewhat greater than one and accounts for process variations in the locations of the stops 38 relative to the retainers 16. With the stops 38, the length $L_{occupied}$ which can be occupied by the devices 22 on each die 12 will be given by:

$$L_{occupied} = L_{chip} - 2\lfloor W_{etch}(f_s - 1) + 2W_{gap} + W_{stop} \rfloor$$

where $W_{gap}$ is a gap between the stop 38 and the adjacent retainer 16, and $W_{stop}$ is the width of each stop 38. The distance $W_{gap}$ can also be used as the distance between each stop 38 and the adjacent device 22.

Figure 5:
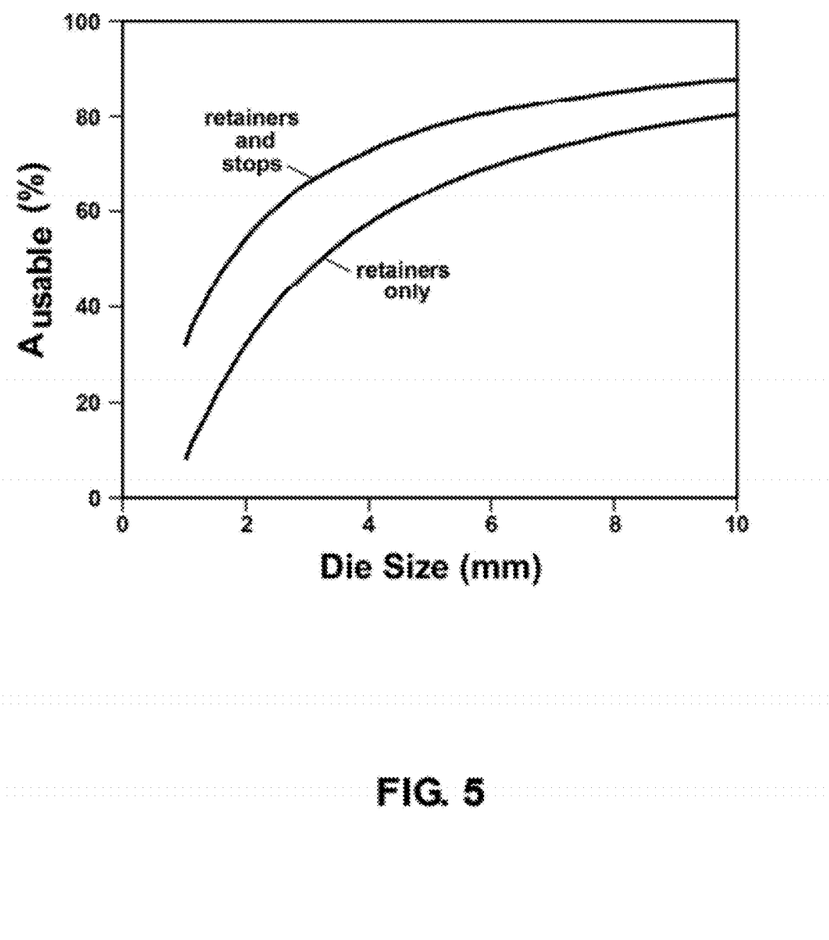
FIG. 5 shows curves to illustrate the dependence of the usable area $A_{usable}$ (expressed in percent) on the size of the die when retainers are provided according to the present invention and with and without stops for limiting a sliding movement of the die after singulation.

To maximize $A_{usable}$, whether or not stops 38 are used, the values of $f_r$ or $f_s$, $W_{etch}$ and $L_{edge}$ can be minimized. Alternately, if $L_{chip}$ is sufficiently large, then a large $A_{usable}$ will be attained. FIG. 5 shows curves of the usable area $A_{usable}$ as a function of the size of the die 12 with and without stops 38. The calculations used to generate the curves of FIG. 5 assumed that the die 12 were square with the following conservative values for the various parameters discussed above: $f_r = f_s = 1.25$, $W_{etch} = 100$ μm, $L_{edge} = 175$ μm, $W_{stop} = 32$ μm, and $W_{gap} = 2$ μm. The relatively large value of $L_{edge} = 175$ μm was selected to also allow singulation of the die 12 by sawing and to provide sufficient space between adjacent die 12 so that tweezers could be used to pick up the singulated die 12 by their edges. Those skilled in the art know that other values can be used for the above parameters. When the retainers 16 are used without any stops 38, the usable area $A_{usable}$ can range from about 10% to about 80% for die sizes from 1 millimeter (mm) to 10 mm for the above parameter values. If stops 38 are added proximate to the retainers 16, the usable area $A_{usable}$ can be increased to about 35% for a 1-mm die size, and can increase to about 88% for 10-mm die size using these same parameter values.

Returning to the method of the present invention in FIG. 2, once the trenches 34 have been etched through the substrate 10 in step 104, a handle wafer 18 can be attached to the bottom side 36 of the substrate 10 in step 106. The handle wafer 18 can comprise silicon (e.g. a bulk silicon substrate which can be optionally overcoated with a layer of silicon nitride). Alternately, the handle wafer 18 can comprise other materials which are resistant to etching in an etchant comprising hydrofluoric acid (e.g. a polymer such as polytetrafluoroethylene or polyvinyl chloride, sapphire, alumina, or a metal such as stainless steel).

It is not necessary that the handle wafer 18 uniformly contact the bottom side 36 of the substrate 10 although this is generally preferable to limit any vertical movement of the die 12 after singulation. All that is necessary is that any gap between the handle wafer 18 and the bottom side 36 of the substrate 10 (e.g. due to bowing or surface roughness of the substrate 10 and/or the handle wafer 18) be smaller than the thickness of the die 12 so that the die 12 will be retained within the package 20 formed by the frame 14 and handle wafer 18 after the die 12 are singulated. In some cases, the substrate 10 will initially be bowed by stress produced by the sacrificial material in the layer(s) 24, and this bowing of the substrate 10 will be reduced as the sacrificial material is partially or completely removed during the etching step 108. When stops 38 are used on the die 12, the gap between the handle wafer 18 and the bottom side 36 of the substrate 10 after the etching step 108 should preferably be smaller than the height of the stops 38 to limit any sliding movement of the singulated die 12 beneath the retainers 16 which could possibly damage the device 22 (e.g. a MEMS device) on the die 12 or obscure the die 12 during a subsequent process step 110 (e.g. for depositing a layer of metal onto each device 22).

Figure 3C:
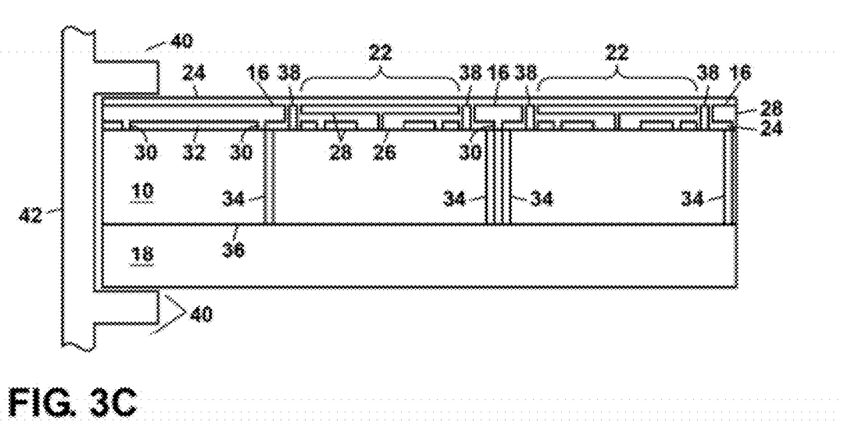

The substrate 10 and the handle wafer 18 can be attached together by inserting them both into a slot 40 of a wafer carrier 42 (also termed a cassette and normally used for batch processing of substrates) which has a plurality of slots 40 with each slot 40 normally being designed to hold only a single semiconductor wafer. This is schematically illustrated in the partial cross-section view of FIG. 3C. Additional substrates 10 and handle wafers 18 can be mated together as shown in FIG. 3C and inserted into additional slots 40 of the wafer carrier 42 when a plurality of substrates 10 are being batch processed according to method 100 of the present invention. In some cases, a single-slot wafer carrier 42 can be used when only a single substrate 10 is being processed according to the method 100 of the present invention. The wafer carrier 42, which can be commercially procured and can be formed, for example, from polytetrafluoroethylene, acts as a temporary fastener to attach the handle wafer 18 to the substrate 10 during an etching step 108 which is used to etch away part or all of the sacrificial layer(s) 24.

Figure 3D:
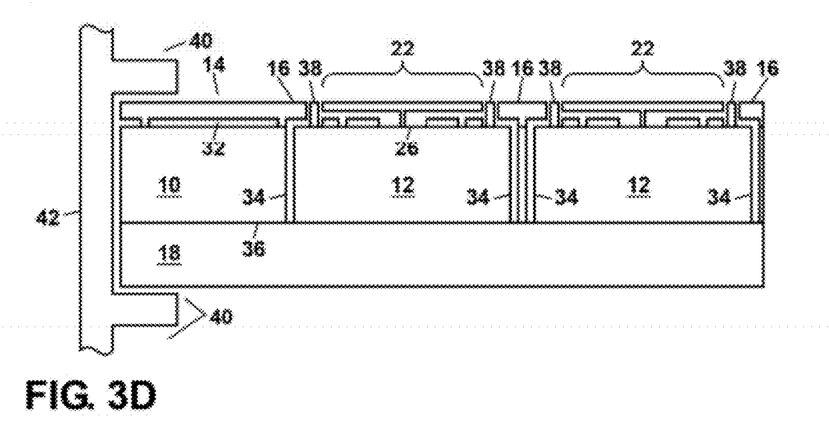

With the substrate 10 and the handle wafer 18 attached together as shown in FIG. 3C the etching step 108 can be performed to etch away at least a part of the sacrificial layer(s) 24 to singulate the die 12 and to complete the frame 14. This etching step 108, which is schematically illustrated in FIG. 3D, can be performed using an etchant which is selective to etch the sacrificial material in each layer 24 but which does not substantially etch the device layers 28 or the substrate 10. The etchant used for step 108 can comprise, for example, hydrofluoric acid (HF) either in a wet solution or in vapor form when the substrate 10 and device layers 28 comprise silicon and the sacrificial layer 24 comprises silicon dioxide or a silicate glass. The etchant can be timed to selectively etch away the sacrificial layer 24 between the retainers 16 and the die 12 to singulate the die 12 and at the same time can remove exposed portions of the sacrificial layer 24 which surround certain features of the device 22 (e.g. moveable elements of a MEMS device 22) formed on each die 12, thereby releasing these features. A plurality of etch access openings (not shown) can be formed through the device layers 28 as needed to provide access of the etchant to the underlying sacrificial material. The etching step 108 can be performed over a time period of a few minutes or longer. Encapsulated portions 32 of the sacrificial layer 24, which are not exposed to the etchant, will not be etched away during the etching step 108. Once the die 12 are singulated by the etching step 108, the die 12 remain trapped between the retainers 16 on the frame 14 and the handle wafer 18.

At the completion of the etching step 108, the etchant can be rinsed away with deionized water. When the device 22 comprises a MEMS device, the wafer carrier 42 containing the frame 14, which is formed from the substrate 10, and the handle wafer 18 and the trapped singulated die 12 can be transferred into an isopropanol bath to rinse away the water. Then the wafer carrier 42 can be transferred to a critical-point drying chamber where the isopropanol can be displaced by liquid carbon dioxide ($CO_2$). The critical-point drying chamber can then be brought to supercritical conditions for the $CO_2$ (e.g. a temperature of 31.1° C. and a pressure of 7.39 MPa) where surface tension in the MEMS device will be negligible, and then the $CO_2$ can be slowly vented out of the critical-point drying chamber as a gas to return the chamber down to atmospheric pressure. This drying process eliminates capillary forces on the MEMS device 22 to prevent stiction (i.e. adhesion) and damage of the MEMS device 22 which can otherwise occur when the die 12 containing the MEMS device 22 is directly removed from the deionized water and air dried.

Figure 3E:
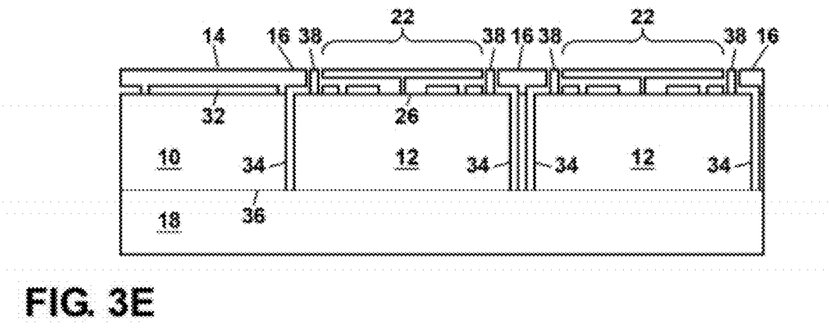

The substrate 10 with the completed frame 14 formed therefrom and the handle wafer 18 can then be removed from the slot 40 in the wafer carrier. This can be done, for example, by hand with the singulated die 12 being held in place between the frame 14 and the handle wafer 18 as illustrated in FIG. 3E.

Figure 3F:
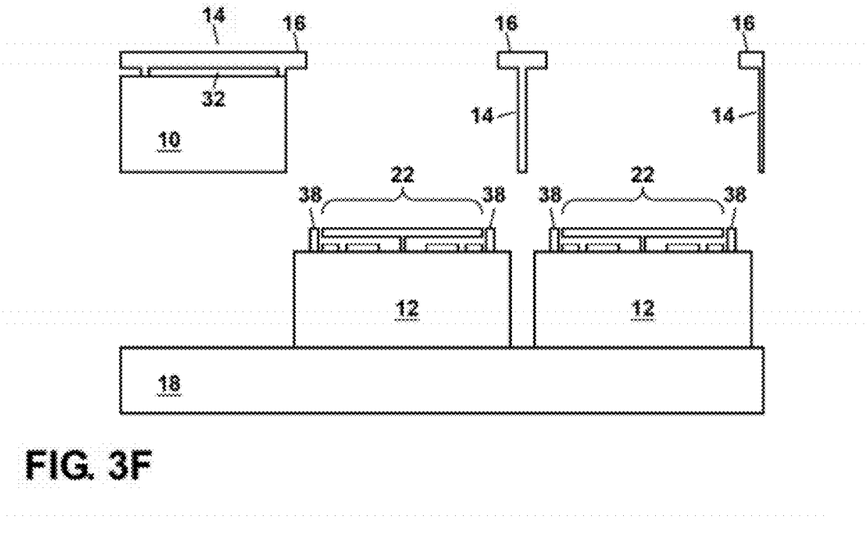

When no further processing of the singulated die 12 is required, a step 112 for detaching the frame 14 from the handle wafer 18 can be performed. This is schematically illustrated in FIG. 3F. The frame 14 can be detached by lifting the frame 14 off of the handle wafer 18 using a pair of tweezers or a vacuum wand (not shown). The frame 14 can be lifted straight up with the handle wafer 18 remaining on a level surface to prevent the singulated die 12 from sliding about on the handle wafer 18. With the frame 14 detached from the handle wafer 18, the singulated die 12 will remain in place on the handle wafer 18 with the die 12 being spaced apart as shown in FIG. 3F. The singulated die 12 can then be individually lifted off of the handle wafer 18 using tweezers, or a vacuum wand or an automated pick and place tool and then placed in a container (e.g. a Gel Pak container), or in a permanent package.

The method 100 of the present invention is advantageous in that it can significantly reduce handling of individual die 12 since the die 12 need only to be picked up once when they are removed from the handle wafer 18. This significantly reduces particle generation and damage due to handling of the individual die 12. All of the die 12 from a single substrate 10 (i.e. a wafer) can be processed in parallel since the die 12 are trapped between the frame 14 and the handle wafer 18 after singulation. This can also save time, reduce cost and improve yield for singulating the die 12 and for any post-processing of the die 12 after singulation since the die 12 from an entire wafer 10 with a diameter of up to 6 inches or larger can be processed in parallel without any handling of individual die 12 until the die 12 are removed for insertion into a container or a permanent package. Batch processing of a plurality of wafers 10 is also possible using the method 100 of the present invention.

The singulated die 12 can also be left in place between the frame 14 and the handle wafer 18. In this case, the frame 14 and the handle wafer 18 can form a package 20 for the singulated die 12. To keep the frame 14 and the handle wafer 18 attached together, one or more clamps 44 or clips 46 can be provided around the periphery of the frame 14 and handle wafer 18 and used as temporary fasteners until the singulated die 12 are to be removed from the package 20.

Figure 3G:
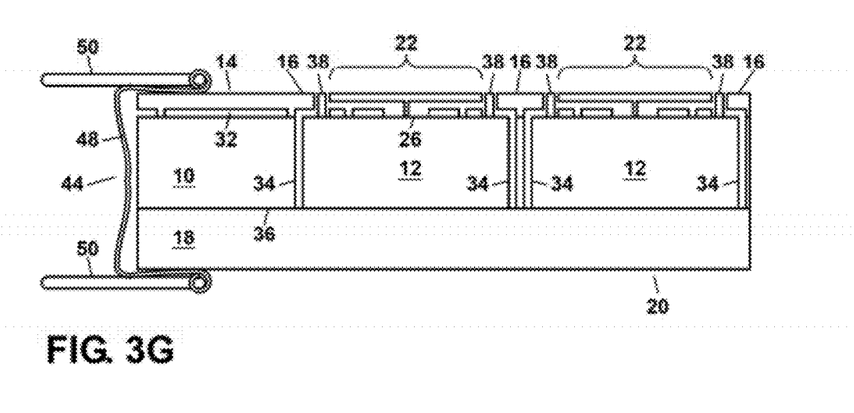

FIG. 3G schematically illustrates in partial cross-section view an example of a clamp 44. The clamp 44 in FIG. 3G is a spring clamp 44 which comprises a spring 48 and a pair of lever arms 50 which can be used to open the spring clamp 44 so that the spring clamp 44 can be inserted around the frame 14 and the handle wafer 18 to clamp the frame 14 and the handle wafer 18 together. The lever arms 50 can then be removed from the spring 48 if this is needed (e.g. to save space or for compatibility with further processing of the singulated die 12). The clamp 44 can be formed of metal (e.g. iron or stainless steel), or a polymer (e.g. polytetrafluoroethylene also known as Teflon), or both. One example of a spring clamp 44 is a so-called binder clip which is normally used for attaching papers together. Those skilled in the art will understand that other types of clamps 44 can be used for practice of the present invention. As an example, the clamp 44 can comprise a band clamp which fits around the periphery of the frame 14 and the handle wafer 18 to attach the frame 14 to the handle wafer 18.

Figure 3H:
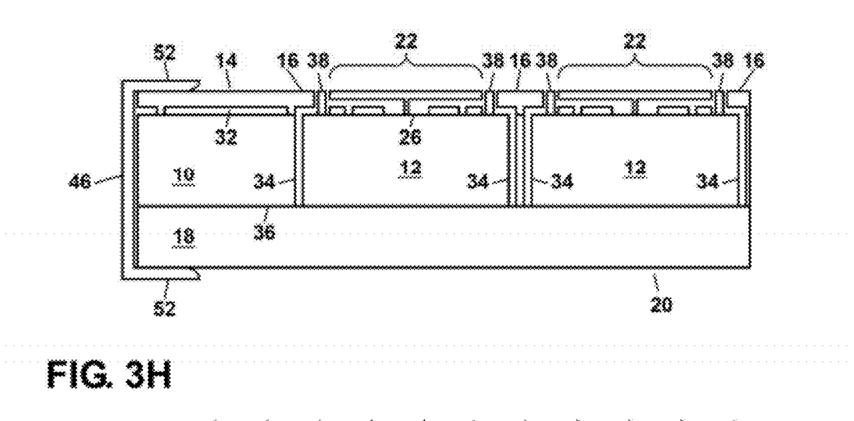

FIG. 3H schematically illustrates in partial cross-section view an example of one or more clips 46 which can be used to attach the handle wafer 18 to the bottom side 36 of the substrate 10. Each clip 46 can comprise a sliding clip 46 which has a pair of arms 52 which are spaced apart by a distance which is about equal to an overall thickness of the handle wafer 18 and the frame 14 or less. A free end of each arm 52 can be tapered as shown in FIG. 3H to facilitate sliding each clip 46 over the frame 14 and the handle wafer 18 to attach the frame 14 to the handle wafer 18. Each clip 46 can comprise, for example, a polymer (e.g. polytetrafluoroethylene) or metal (e.g. iron or stainless steel), or both (e.g. metal with a polymer overcoating).

The attachment of the frame 14 to the handle wafer 18 with one or more clamps 44 or clips 46 as shown in FIGS. 3G and 3H can be used to form the package 20 for the singulated die 12. This package 20 can be used for handling, for storage, or for transporting of the singulated die 12. One or more processing steps 110 can be optionally performed to deposit a material 54 onto a surface of the singulated die 12 while the die 12 are being held within the package 20.

Figure 3I:
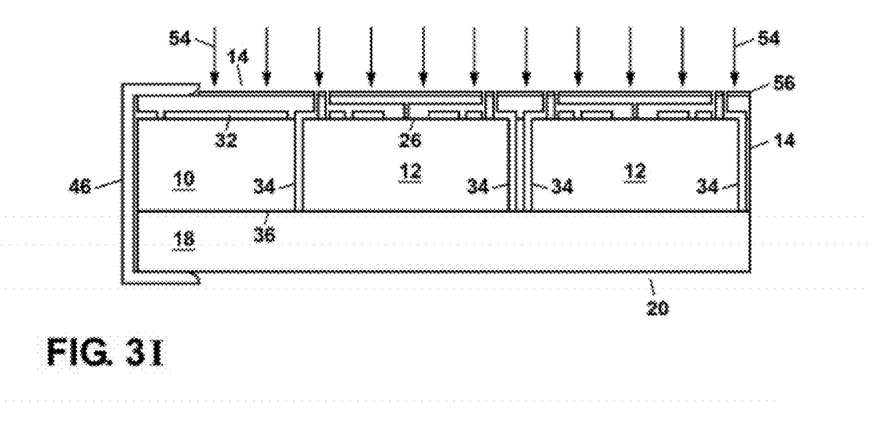

An example of a processing step 110 whereby a layer 56 of the material 54 is deposited over an upper surface of the device 22 on each die 12 is schematically illustrated in the partial cross-section view of FIG. 3I. The material 54 deposited onto the surface of the singulated die 12 in this processing step 110 can be a metal which can be used, for example, to form a reflective coating for a MEMS micromirror device 22, or an electrode for a MEMS switching device 22. The material 54 can also be a wear-resistant material such as silicon nitride, diamond, or tungsten. Furthermore, the material 54 can be any of the adhesion-reducing materials or anti-stiction materials which are commonly used for MEMS, or a passivation material such as silicon nitride, or a combination of the materials discussed above. The material 54 can be deposited by evaporation or sputtering, or from a vapor or a plasma, or by a chemical vapor deposition (CVD) process or an atomic layer deposition (ALD) process, or as a self-assembled monolayer (SAM) deposition process depending upon the exact material 54 which is to be deposited in the optional processing step 110. Those skilled in the art will understand that the processing step 110 can be any type of processing step which can be carried out while the singulated die 12 are located within the package 20 formed by the frame 14 and the handle wafer 18.

During the processing step 110, the assembly of FIG. 3I comprising the die 12 trapped inside the package 20 formed by the frame 14 and handle wafer 18 can be turned upside down if needed (e.g. for evaporating a metal layer onto a surface of the device 22 on each die 12) since the die 12 cannot fall out of the package 20. When one or more stops 38 are provided on the die 12, the package 20 can be oriented at any arbitrary angle during the processing step 110 since the stops 38 limit the sliding movement of the die 12. This is useful, for example, for depositing different metals onto opposing contacts of a MEMS switch 22 since the package 20 can be oriented at one angle (e.g. +45°) to deposit one type of metal onto one of the opposing contacts (e.g. using a shadow mask or an overhang in a last-deposited device layer 28 to prevent metal deposition onto the other of the opposing contacts and onto the die 12). Then the package 20 can be oriented at another angle (e.g. −45°) to deposit another type of metal onto the other of the opposing contacts.

After the optional processing step 110 described above, the step of detaching the frame 14 from the handle wafer 18 can be performed by removing the clamps 44 or clips 46 and then lifting the frame 14 off of the handle wafer 18 as previously described with reference to FIG. 3F. Alternately, the frame 14 can be left attached to the handle wafer 18 when the singulated die 12 are to be stored or transported within the package 20, or until such time as the die 12 are to be removed from the package 20 and inserted into a permanent package.

Figure 6:
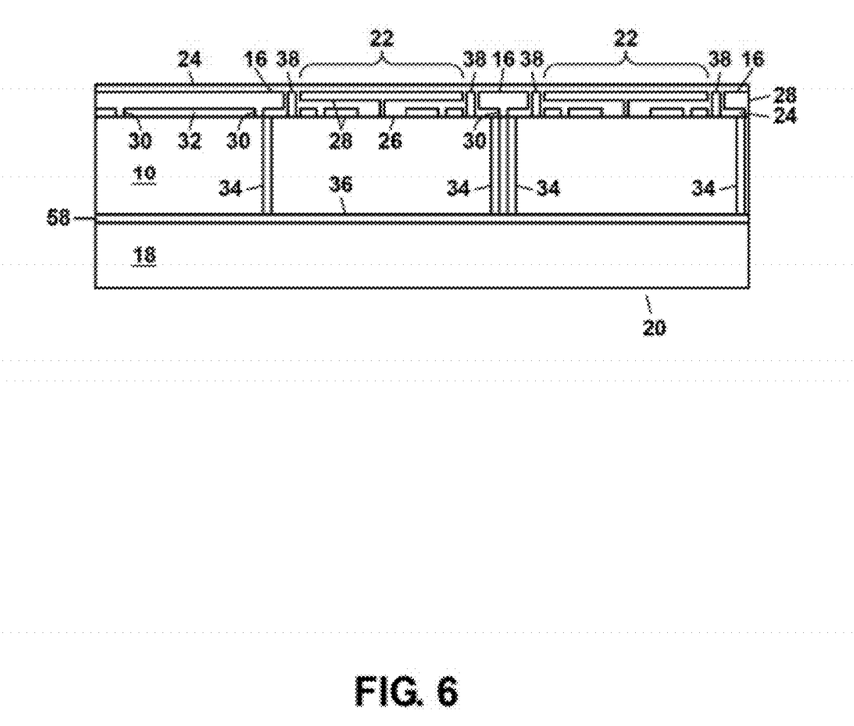
FIG. 6 shows a schematic partial cross-section view along the section line 1-1 in FIG. 1 to illustrate attachment of the handle wafer to the substrate using an adhesive.

In other embodiments of the present invention, the handle wafer 18 can be attached to the substrate 10 using an adhesive 58 as a temporary fastener. This is schematically illustrated in the partial cross-section view of FIG. 6 which is along the section line 1-1 in FIG. 1. As an example, the handle wafer 18 can be a tack tape which is conventionally used for die singulation by saw cutting with the tack tape 18 having a low-tack or a medium-tack adhesive 58 on one side of the tack tape (e.g. a polyvinyl chloride tack tape with a synthetic acrylic adhesive 58). After etching the sacrificial layer 24 in step 108 and completing the frame 14, the tack tape 18 can be peeled off of the frame 14 with the singulated die 12 remaining adhered to the tack tape 18 by the adhesive 58. The tack tape 18 can then be optionally stretched laterally to increase the spacing between the adjacent die 12 in preparation for individually detaching the die 12 from the tack tape 18 to insert the die 12 into a container or a permanent package.

Figure 7:
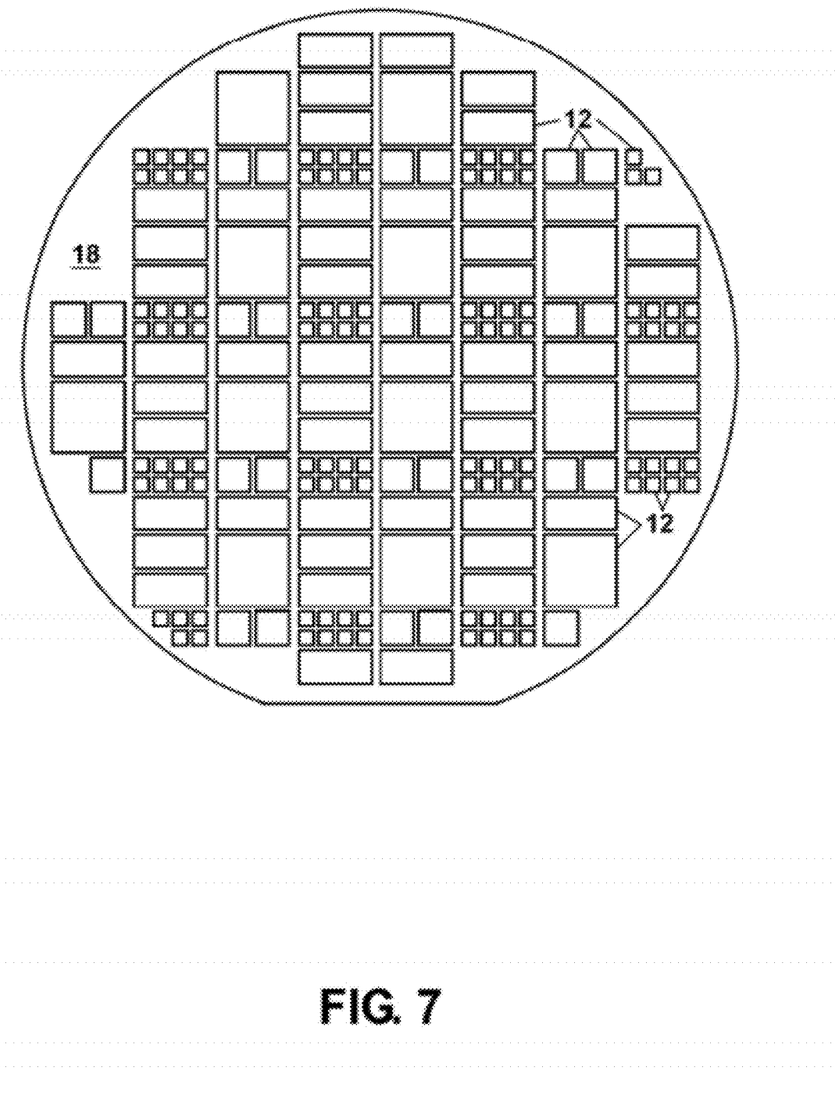
FIG. 7 shows a schematic plan view of a plurality of die on the handle wafer after singulation of the die to illustrate that die of various sizes and shapes can be singulated according to the method of the present invention.

The method 100 of the present invention can be applied to die 12 of an arbitrary size and shape, including polygonal or curved shapes. This is useful when a number of different device designs are to be fabricated on the same substrate 10 since it allows more of the overall surface area of the substrate 10 to be utilized for fabrication of different devices 22 and die 12. This is schematically illustrated in FIG. 7 which shows a schematic plan view of a plurality of die 12 of different sizes and shapes after singulation according to the method 100 of the present invention, with the die 12 remaining on the handle wafer 18 after removal of the frame 14 in step 112.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for singulating a die from a substrate, comprising the steps of:
    providing the substrate having a top side and a bottom side, with a plurality of layers being disposed on the top side of the substrate including a sacrificial layer and a device layer located above the sacrificial layer, with the device layer being patterned to form a retainer which is anchored to a first portion of the substrate which in combination with the device layer will form a frame about the die after singulation of the die, and with the retainer extending over a second portion of the substrate which will be singulated to form the die;
    etching at least one trench into the substrate from the bottom side thereof to define a shape for the die being singulated, with the etching being terminated proximate to the sacrificial layer;
    attaching a handle wafer to the bottom side of the substrate; and
    etching away at least a part of the sacrificial layer to singulate the die, with the singulated die being retained inside of the frame which is attached to the handle wafer.

2. The method of claim 1 further comprising the steps of detaching the frame from the handle wafer, with the die remaining on the handle wafer.

3. The method of claim 1 wherein the handle wafer comprises a semiconductor substrate.

4. The method of claim 1 wherein the substrate comprises monocrystalline silicon.

5. The method of claim 1 wherein the sacrificial layer comprises silicon dioxide or a silicate glass.

6. The method of claim 1 wherein the device layer comprises a polycrystalline silicon layer or a monocrystalline silicon layer.

7. The method of claim 1 wherein the step of etching the at least one trench into the substrate comprises anisotropically etching the at least one trench using a deep reactive ion etching (DRIE) process.

8. The method of claim 1 wherein the step of etching away at least a part of the sacrificial layer to singulate the die and to complete the frame comprises isotropically etching the sacrificial layer.

9. The method of claim 1 wherein the step of attaching the handle wafer to the substrate comprises inserting the handle wafer and the substrate into a wafer carrier having a plurality of slots for holding wafers, with the handle wafer and the substrate being located in the same slot of the wafer carrier.

10. The method of claim 1 wherein the step of attaching the handle wafer to the substrate comprises clamping the handle wafer to the substrate using at least one clamp or at least one clip.

11. The method of claim 1 wherein the step of attaching the handle wafer to the substrate comprises attaching the handle wafer to the substrate with an adhesive.

12. The method of claim 1 wherein the handle wafer attached to the substrate forms a package for the singulated die.

13. The method of claim 2 further comprising the step of depositing a layer of a material onto a surface of the die prior to the step of detaching the frame from the handle wafer.

14. The method of claim 13 wherein the material comprises a metal.

15. The method of claim 13 wherein the material is selected from the group consisting of a wear-resistant material, an adhesion-reducing material, a stiction-reducing material, a passivation material, and combinations thereof.

16. A method for singulating a die formed from a semiconductor substrate having a sacrificial material disposed thereon, comprising the steps of:
    forming a retainer on a first portion of the semiconductor substrate which will form a frame about the die after singulation of the die, with the retainer extending over a second portion of the semiconductor substrate which will be singulated to form the die;
    anisotropically etching a trench about the die by anisotropically etching through the semiconductor substrate from a bottom side thereof opposite the retainer;
    attaching a handle wafer to the bottom side of the semiconductor substrate; and
    at least partially removing the sacrificial material from the semiconductor substrate by isotropically etching the sacrificial material, thereby separating the first portion of the semiconductor substrate which forms the frame from the second portion of the semiconductor substrate which forms the singulated die.

17. The method of claim 16 further comprising the step of detaching the frame from the handle wafer, with the die remaining on the handle wafer.

18. The method of claim 16 wherein the step of forming the retainer on the first portion of the semiconductor substrate comprises depositing and patterning one or more layers of polycrystalline silicon on the semiconductor substrate.

19. The method of claim 16 wherein the semiconductor substrate comprises silicon, and the sacrificial material comprises silicon dioxide or a silicate glass.

20. The method of claim 16 wherein the step of anisotropically etching the trench about the die comprises anisotropically etching the trench using a deep reactive ion etching (DRIE) process.

21. The method of claim 16 wherein the step of attaching the handle wafer to the semiconductor substrate comprises inserting the handle wafer and the semiconductor substrate into a slot of a wafer carrier with both the handle wafer and the semiconductor substrate being located in that same slot of the wafer carrier, and with the handle wafer being in contact with the bottom side of the semiconductor substrate.

22. The method of claim 16 wherein the step of attaching the handle wafer to the semiconductor substrate comprises clamping the handle wafer to the semiconductor substrate using at least one clamp or at least one clip.

23. The method of claim 17 further comprising the step of depositing a layer of a material onto a surface of the die prior to the step of detaching the frame from the handle wafer.

24. The method of claim 23 wherein the step of depositing the layer of the material onto the surface of the die comprises depositing a layer of a metal onto the surface of the die.

25. The method of claim 19 wherein the handle wafer comprises silicon.

* * * * *